US011164382B2

(12) United States Patent
Hewitt et al.

(10) Patent No.: US 11,164,382 B2
(45) Date of Patent: Nov. 2, 2021

(54) ALTERATION OF A VIRTUAL REALITY SIMULATION

(71) Applicant: International Business Machines Corporation, Armonk, NY (US)

(72) Inventors: Trudy L. Hewitt, Cary, NC (US); Robert Huntington Grant, Atlanta, GA (US); Jeremy R. Fox, Georgetown, TX (US); Zachary A. Silverstein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 16/417,977

(22) Filed: May 21, 2019

(65) Prior Publication Data

US 2020/0372713 A1 Nov. 26, 2020

(51) Int. Cl.
*G06T 19/00* (2011.01)
*G06F 30/20* (2020.01)
*G06T 7/00* (2017.01)

(52) U.S. Cl.
CPC ............ *G06T 19/006* (2013.01); *G06F 30/20* (2020.01); *G06T 7/0012* (2013.01)

(58) Field of Classification Search
None
See application file for complete search history.

(56) References Cited

U.S. PATENT DOCUMENTS

| 8,605,141 | B2 | 12/2013 | Dialameh et al. |
| 10,171,858 | B2 | 1/2019 | George et al. |
| 2013/0083007 | A1* | 4/2013 | Geisner ................ G02B 27/017 345/419 |
| 2014/0287389 | A1* | 9/2014 | Kallmann .............. G16H 20/30 434/247 |
| 2017/0095732 | A1 | 4/2017 | Ghaffari et al. |
| 2018/0276895 | A1 | 9/2018 | Hodge |
| 2018/0286007 | A1 | 10/2018 | Poornachandran et al. |
| 2019/0102874 | A1* | 4/2019 | Goja ...................... G06Q 10/06 |

(Continued)

OTHER PUBLICATIONS

Charles, Darryl, et al. "Player-centred game design: Player modelling and adaptive digital games." (2005): 285-298.*

(Continued)

*Primary Examiner* — Zhengxi Liu
(74) *Attorney, Agent, or Firm* — Peter K. Suchecki

(57) ABSTRACT

Provided is a method, computer program product, and virtual reality (VR) system for altering a VR simulation based on the physical capabilities of a user. A processor may receive one or more personal health factors corresponding to a user. The processor may prepare a VR simulation for a rendering. The processor may identify one or more physical characteristics of the user from the personal health factors. The processor may determine if the one or more physical characteristics affect the interaction of the user within the VR simulation. The processor may modify, in response to determining the one or more physical characteristic affect the interaction of the user within the VR simulation, user input options for interacting with the VR simulation. The processor may modify the rendering of the VR simulation in a display of a VR device based on the modified user input options.

18 Claims, 8 Drawing Sheets

(56) References Cited

U.S. PATENT DOCUMENTS

2019/0265802 A1* 8/2019 Parshionikar ........... G06F 3/012

OTHER PUBLICATIONS

Ma, Minhua, et al. "Adaptive virtual reality games for rehabilitation of motor disorders." international conference on universal access in human-computer interaction. Springer, Berlin, Heidelberg, 2007.*

Charles, Darryl, and Michaela Black. "Dynamic player modeling: A framework for player-centered digital games." Proc. of the International Conference on Computer Games: Artificial Intelligence, Design and Education. 2004.*

Brennan, "Developer Makes VR Accessible to Physically Disabled with Custom Locomotion Driver", published on May 12, 2017, retrieved from https://www.roadtovr.com/developer-makes-vr-accessible-physically-disabled-custom-locomotion-driver/ on Apr. 15, 2021.*

Micheals, "Microsoft Upgrades Xbox Avatars, Adds Wheelchairs", published on Jan. 24, 2018, retrieved from https://www.rollingwithoutlimits.com/view-post/Microsoft-Upgrades-Xbox-Avatars-Adds-Wheelchair on Apr. 15, 2021.*

Pirovano, Michele, et al. "Self-adaptive games for rehabilitation at home." 2012 IEEE Conference on Computational Intelligence and Games (CIG). IEEE, 2012.*

Vaughan, Neil, Bodgan Gabrys, and Venketesh N. Dubey. "An overview of self-adaptive technologies within virtual reality training." Computer Science Review 22 (2016): 65-87.*

Finn, G., "Why Augmented Reality and Virtual Reality Will be Important for Your Business," https://www.entrepreneur.com/article/300071, printed Mar. 1, 2019, 3 pgs.

Mell et al., "The NIST Definition of Cloud Computing," Recommendations of the National Institute of Standards and Technology, U.S. Department of Commerce, Special Publication 800-145, Sep. 2011, 7 pgs.

PRNewswire, "Augmented Reality (AR) and Virtual Reality (VR) market Worth 60.55 Billion USD and 34.08 Billion USD by 2023," https://www.prnewswire.co.uk/news-releases/augmented-reality-ar-and-virtual-reality-vr-market-worth-6055-billion-usd-and-3408-billion-usd-by-2023-675413053.html, Feb. 28, 2018, printed Mar. 4, 2019, 3 pgs.

Riva et al., "Transforming Experience: The Potential of Augmented Reality and Virtual Reality for Enhancing Personal and Clinical Change," https://www.ncbi.nlm.nih.gov/pmc/articles/PMC5043228/, printed Mar. 1, 2019, 34 pgs.

Unknown, "VR Games for all—Designing Unseen Diplomacy for Disabled Users," http://www.triangularpixels.net/cms/development/vr-games-for-all-designing-unseen-diplomacy-for-disabled-users/, printed Mar. 1, 2019, 3 pgs.

Unknown, "Walkin VR Driver," https://www.walkinvrdriver.com/, printed Mar. 1, 2019, 7 pgs.

* cited by examiner

| VR Simulation | Personal Health Factor | Physical Characteristic | User Input Modification | VR Simulation Modification |
|---|---|---|---|---|
| Horseshoe Throwing Game | Cast on left arm/hand (image analysis) | Cannot use left arm/hand | Shift all UI interaction to right side | Render horseshoes thrown from the right side |
| Adventure Game | Leg impairment (action analysis) | Cannot jump | User required to swing arms in jumping scenarios | Render rope to swing from in jumping scenarios |
| Racing Game | Motion sickness (manual entry) | Limit fast movements | Limit head turning interactions | Render straight racing track |

```
Analyze historical data corresponding to actions performed by the user
interacting in a prior VR simulation
505
                          │
                          ▼
Identify one or more personal health factors from the analyzed data
510
```

```
Receive crowdsourced historical data for a plurality of users
605
                          │
                          ▼
Analyze the crowdsource historical data
610
                          │
                          ▼
Generate updated mapping table
615
```

ALTERATION OF A VIRTUAL REALITY SIMULATION

BACKGROUND

The present disclosure relates generally to the field of virtual reality (VR), and more specifically, to altering a VR simulation based on the physical capabilities of a user.

As VR becomes more prevalent, users are becoming increasingly interested in performing virtual actions within a VR simulation that match their actions performed in the real world.

SUMMARY

Embodiments of the present disclosure include a method, computer program product, and virtual reality (VR) system for altering a VR simulation based on the physical capabilities of a user. A processor may receive one or more personal health factors corresponding to a user. The processor may prepare a VR simulation for a rendering. The processor may identify one or more physical characteristics of the user from the personal health factors. The processor may determine if the one or more physical characteristics affect the interaction of the user within the VR simulation. The processor may modify, in response to determining the one or more physical characteristic affect the interaction of the user within the VR simulation, user input options for interacting with the VR simulation. The processor may modify the rendering of the VR simulation in a display of a VR device based on the modified user input options.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 4 illustrates an example mapping table, in accordance with embodiments of the present disclosure.

FIG. 5 illustrates a flow diagram of an example process for analyzing historical user action data to identify one or more personal health factors, in accordance with embodiments of the present disclosure.

FIG. 6 illustrates a flow diagram of an example process for analyzing crowdsourced historical data for a plurality of users to improve modification of the VR simulation, in accordance with embodiments of the present disclosure.

Figure 1:
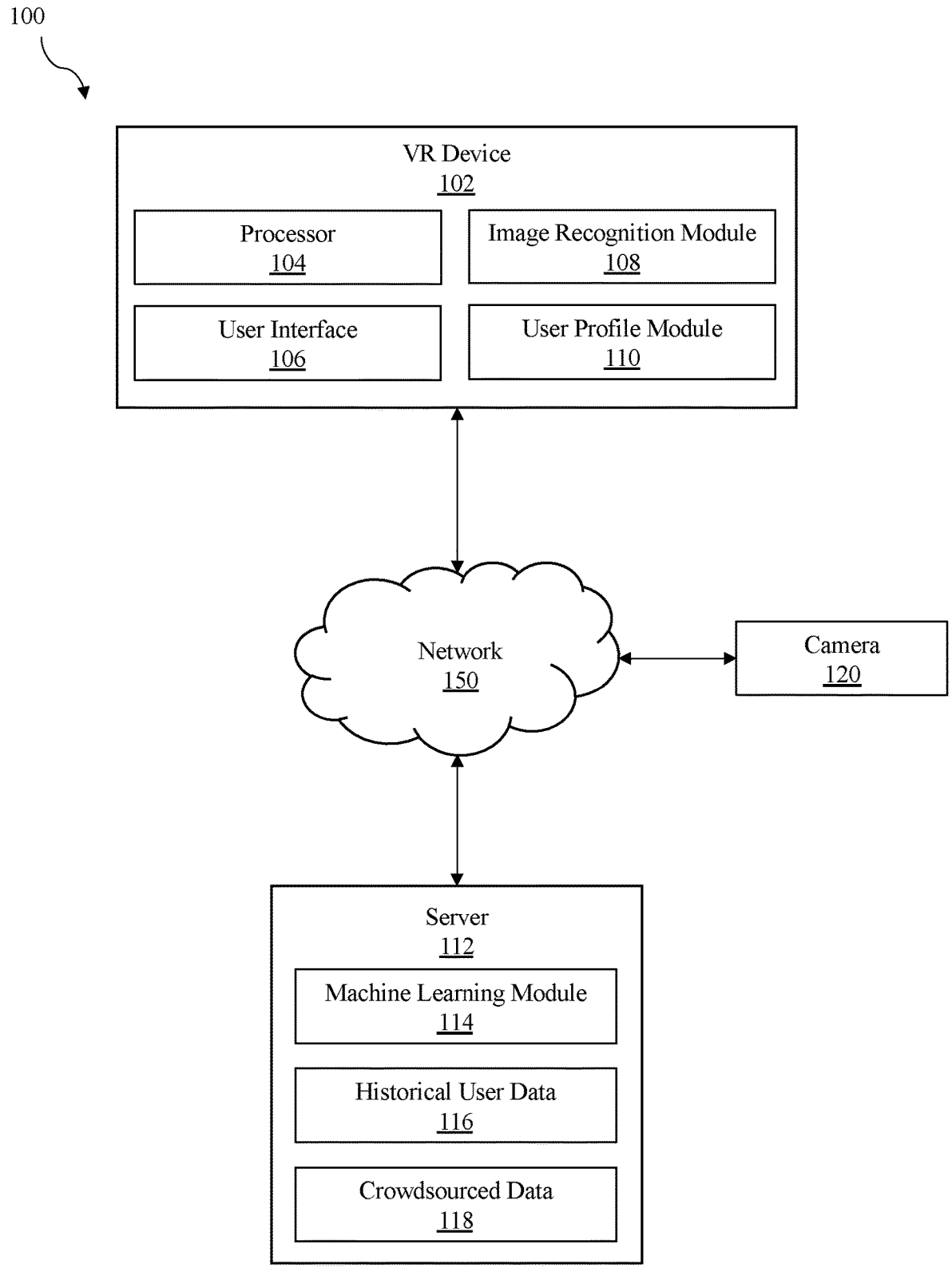
FIG. 1 illustrates a block diagram of a virtual reality (VR) system, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate to the field of virtual reality (VR), and more particularly to altering a VR simulation based on the physical capabilities of a user. While the present disclosure is not necessarily limited to such applications, various aspects of the disclosure may be appreciated through a discussion of various examples using this context.

As VR becomes more prevalent, users are becoming increasingly interested in performing virtual actions within a VR simulation that match their physical actions performed in the real world. For example, within a VR simulation the user may be required to jump over a virtual object to advance forward in a game. In order to perform the virtual jumping action, the user may be required to physically jump in the external real-world environment. However, some users may not be able to perform various actions required to achieve certain goals within the VR simulation. For example, a user that may have an impairment in their legs may not be able to physically jump to perform the virtual jumping action. Therefore, the user with a leg impairment may not be able to complete certain tasks within the VR simulation.

Embodiments of the present disclosure alter the VR simulation based on the physical capabilities of a user. In embodiments, a VR system may determine personal health factors associated with a user. The personal health factors may be gathered from user profile data, image recognition analysis of the user, and/or through analysis of the user's actions within the VR simulation itself. For example, the system may analyze an image of the user and determine that a user has a broken left leg because of the presence of a cast on the user. In another example, the system may analyze user interaction data taken from the VR simulation and determine the user has limited movement of their right arm. In embodiments, the personal health factors and/or any associated personal data is collected with the user's informed consent as part of an opt in process. Any health/personal data that is collected will be anonymized and/or encrypted to ensure data security and privacy. Further, a user may opt out from having their personal data collected, at which point any personal data regarding the user will be deleted.

In embodiments, once the personal health factors of the user are determined, the VR system may identify one or more physical characteristics that affect the user's interaction within the VR simulation from the personal health factors. For example, the VR system may determine that because the user has a broken left leg (e.g., personal health factor), any actions performed by the user using the left leg within VR simulation will be limited. For example, the user may not be able to perform jumping actions when interacting within the VR simulation.

In embodiments, the VR system may modify user input options for interacting with the VR simulation based on the identified physical characteristics. For example, user input options will be modified to change input actions for jumping to now require the user to perform arm actions instead. Once the user input options are modified, the VR system may modify the rendering of the VR simulation based on the modified user input options. For example, in a non-modified version of a VR adventure game a barrel may be rolling towards the user that requires the user to jump over the barrel. However, because the user input options have been modified to require the user to perform actions with their arms rather than their legs, the VR system may modify the VR simulation to change the barrels in the simulation to vines, such that the user is required to use the arms to swing on the vines. In this way the VR simulation may be modified to match the physical capabilities of the user.

In embodiments, the VR system may analyze historical data corresponding to actions performed by the user interacting in prior VR simulations and identify one or more personal health factors from this data using machine learning. For example, the VR system may identify that the user's actions performed in historical VR simulations indicate that the user does not perform actions with their left arm. The VR system may update the user's profile with the identified personal health factor and modify further VR simulations accordingly. For example, any VR simulation requiring use of the left arm will shift the user input options to the right arm.

In embodiments, crowdsourced data may be received by the system and analyzed to generate and/or update a mapping table for modifying the rendering of the VR simulation based on identified physical characteristics of a plurality of users. For example, the system may use machine learning to predict suitable modifications to the VR simulation by determining what historical modifications have been successful for other users with certain physical characteristics. In this way, using the crowdsourced data allows the system to adequately modify the VR simulation based on any identified physical characteristics for a specific user.

While VR may be used as the primary example herein, this is not limiting on the implementation of the system. Embodiments of the present disclosure may be applied to augmented reality (AR), mixed reality (MR), augmented virtuality (AV), and other forms of real-and-virtual combined environments and human-machine interactions generated by computer technology and wearables.

The aforementioned advantages are example advantages, and not all advantages are discussed. Furthermore, embodiments of the present disclosure can exist that contain all, some, or none of the aforementioned advantages while remaining within the spirit and scope of the present disclosure.

With reference now to FIG. 1, shown is a block diagram of a virtual reality (VR) system 100, in accordance with embodiments of the present disclosure. In the illustrated embodiment, VR system 100 includes a virtual reality (VR) device 102, server 112, and camera 120 that are communicatively coupled via a network 150. In embodiments, VR device 102, server 112, and camera 120 may be any type of computer system and may be substantially similar to computer system 1101 of FIG. 7.

The network 150 may be any type of communication network, such as a wireless network or a cloud computing network. The network 150 may be substantially similar to, or the same as, cloud computing environment 50 described in FIG. 8 and FIG. 9. In some embodiments, the network 150 can be implemented using any number of any suitable communications media. For example, the network may be a wide area network (WAN), a local area network (LAN), a personal area network (PAN) used for exchanging data over short distances, an internet, or an intranet. In certain embodiments, the various systems may be local to each other, and communicate via any appropriate local communication medium.

For example, VR device 102 may communicate with server 112 and/or camera 120 using a WAN, one or more hardwire connections (e.g., an Ethernet cable) and/or wireless communication networks (e.g., wireless router, personal area network). In some embodiments, the various systems may be communicatively coupled using a combination of one or more networks and/or one or more local connections. For example, VR device 102 may communicate with server 112 using a hardwired connection, while communication between the VR device 102 and camera 120 may be through a wireless communication network (e.g., PAN).

In the illustrated embodiment, VR device 102 includes processor 104, user interface (UI) 106, image recognition module 108, and user profile module 110. UI 106 is configured to output a VR simulation to a user. In embodiments, the VR device 102 may be configured as a VR headset and/or VR console. In some embodiments, VR system 100 may only include the VR device 102. For example, VR device 102 may be a stand-alone system that is not connected to another device (e.g., server 112, camera 120) through a network. In some embodiments, VR device 102 may include camera 120.

In embodiments, image recognition module 108 is configured to analyze image data generated and received from camera 120. Image recognition module 108 may determine personal health factors (e.g., extremity missing, wheelchair detected, eye impairment, etc.) corresponding to a user through image recognition analysis. For example, the image recognition module 108 may determine through image analysis that a user is wearing a cast on their right leg.

In embodiments, user profile module 110 is configured to store personal health factors for each respective user. The user profile module 110 may store personal health factor information gathered from the image recognition module 108. In embodiments, the user profile module 110 may generate and/or update personal health factors for the user based on various interactions and usage patterns from historical data of the user participating in VR simulations. Any personal/health data stored regarding the user will be encrypted to ensure data security and privacy.

For example, the user profile module 110 may determine based on interaction data (e.g., image data, motion data, etc.) that a user only uses their left hand when interacting within the VR simulation. Based on data analysis, the user profile module 110 may update the VR simulation to shift interactions within UI 106 to the left side only. This update may be stored within a user profile for the user.

In embodiments, the user profile module 110 may alter the personal health factors based on user interaction data gathered by the system 100. For example, a user with a broken right arm may only use their left arm for a certain period of time until the cast on their right arm is removed. At that point, the user may begin using both arms within a VR simulation. The user profile module 110 would recognize the change based on user interaction data and update the personal health factors for the user. Because of the updated personal health factors, the modification of the VR simulation would also be changed accordingly.

In embodiments, the personal health factors may be entered manually by a user into a user profile, generated from image recognition data, received from external sources (e.g., public information, social media, etc.), and/or determined through interaction data analysis. In embodiments, the system may perform an initial assessment of the user prior to initiating the VR simulation in order to determine the user's physical capabilities. The assessment may analyze actions of the user and determine which actions meet various modification thresholds. If the user fails to complete an action that meets the threshold, the system may modify VR simulation appropriately. In some embodiments, the personal health factors may be replicated to the user's virtual profile (e.g., user's avatar) within the VR simulation.

Camera 120 may be any type of device that generates image data (e.g., an Internet of Things (IoT) camera, smartphone with camera, etc.). For example, camera 120 may be an IoT camera that is positioned within a room such that an image of the user can be uploaded to the VR device 102. In other embodiments, VR device 102 may include camera 120.

In the illustrated embodiment, VR device 102 is communicatively coupled to server 112. In embodiments, historical user data 116 and/or crowdsourcing data 118 may be received and/or stored on server 112. In some embodiments, historical data 116 and/or crowdsourcing data 118 may be stored on VR device 102. In some embodiments, server 112 may include a cloud database.

In the illustrated embodiment, server 112 includes machine learning module 114. Machine learning module 114 may comprise various machine learning engines (artificial neural network, correlation engines, natural language processing engine, reinforcement feedback learning model, supervised learning model, etc.) configured to analyze data generated from various sources (e.g., linked camera, VR device, crowdsourced data from other VR devices, etc.). In some embodiment, machine learning module 114 may be included in VR device 102. In embodiments, machine learning module 114 may analyze historical user data 116 and/or crowdsourcing data 118. Historical user data may be any type of data generated by the system (e.g., historical user interaction data, historical user image data, etc.).

For example, machine learning module 114 may include one or more artificial neural networks configured to learn from various historical user data 116 received by VR device 102. For example, machine learning module 114 may analyze historical user data 116 for accuracy of predicting personal health factors for a user. The machine learning module 114 may correlate historical user data 116 for a specific user with crowdsourced data 118 from a plurality of users to determine patterns for accurately predicting personal health factors for all users. Once predictions are made based on correlating the data, modifications to the VR simulation may be improved to more accurately correlate to the user's physical capabilities based on their predicted personal health factors. As more data is learned by the system 100, the weights of the neural network can be adjusted, automatically, by processor 104. Over time, the system 100 can become more accurate in properly modifying the VR simulation according to the predicted physical capabilities of the user.

FIG. 1 is intended to depict the representative major components of the VR system 100. In some embodiments, however, individual components may have greater or lesser complexity than as represented in FIG. 1, components other than or in addition to those shown in FIG. 1 may be present, and the number, type, and configuration of such components may vary. Likewise, one or more components shown with the VR system 100 may not be present, and the arrangement of components may vary.

For example, while FIG. 1 illustrates an example VR system 100 having a single VR device 102, one server 112, and one camera 120, suitable network architectures for implementing embodiments of this disclosure may include any number of VR devices, servers, and cameras. The various models, modules, systems, and components illustrated in FIG. 1 may exist, if at all, across a plurality of VR devices, servers, and cameras.

Figure 2:
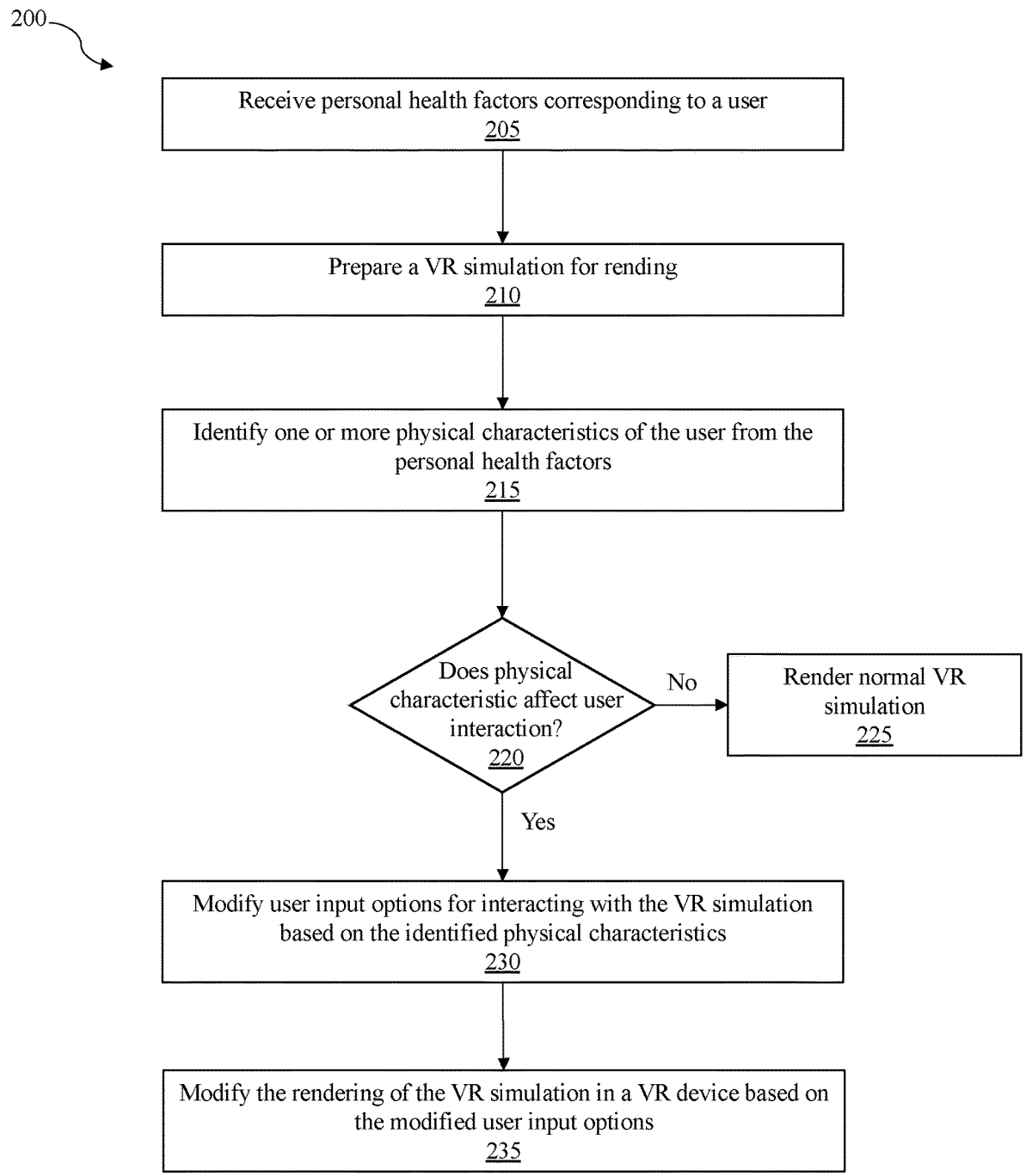
FIG. 2 illustrates a flow diagram of an example process for modifying a VR simulation based on personal health factors, in accordance with embodiments of the present disclosure.

Referring now to FIG. 2, shown is a flow diagram of an example process 200 for modifying a VR simulation base on personal health factors, in accordance with embodiments of the present disclosure. The process 200 may be performed by processing logic that comprises hardware (e.g., circuitry, dedicated logic, programmable logic, microcode, etc.), software (e.g., instructions run on a processor to perform hardware simulation), firmware, or a combination thereof. In some embodiments, the process 200 is a computer-implemented process. The process 200 may be performed by processor 104 exemplified in FIG. 1.

The process 200 begins by receiving one or more personal health factors corresponding to a user. This is illustrated at step 205. The personal health factors may be received from a user profile, determined through image recognition analysis, and/or determined through analysis of user action data within a VR simulation.

For example, a user may include certain information regarding their personal health within their user profile. For example, the user may include that they cannot use their lower extremities. In another example, the user may update their personal health factors in their user profile to indicate they have a broken arm or suffer from motion sickness.

In embodiments, the personal health factors may be identified from image recognition analysis. For example, the VR system may include a camera that captures an image of the user. This image may be analyzed to determine various personal health factors (e.g., cast on arm, pregnant user, missing extremity, etc.).

In another embodiment, the system may determine personal health factors from user interaction data from the VR simulation. For example, the system may determine that the user has a left arm issue based on data indicating the user limits actions performed with their left arm within the VR simulation.

Once the personal health factors are received, the process 200 continues by preparing a VR simulation for a rendering. This is illustrated at step 210. The VR system will initiate the rending of the VR simulation in order to determine what aspects of the simulation will need to be modified based on the personal health factors.

Once the VR simulation is initialized, the process 200 continues by identifying one or more physical characteristics of the user from the personal health factors that may affect the user's interaction within the VR simulation. This is illustrated at step 215. For example, the system may determine that the user may not be able to perform jumping actions (e.g., physical characteristic) within the VR simulation because of the presence of a cast on their leg (e.g., personal health factor).

The process 200 continues by determining if the one or more physical characteristics affect the interaction of the user within the VR simulation. This is illustrated at step 220. For example, a physical characteristic such as leg impairment, may not affect the user's interaction within a VR horseshoe throwing game because the user does not have to use their legs. If the one or more physical characteristics do not affect the interaction of the user within the VR simulation, "No" at step 220, the process 200 continues by rending a normal (e.g., non-modified) VR simulation. This is illustrated at step 225.

If the one or more physical characteristics are determined to affect the interaction of the user within the VR simulation, "Yes" at step 220, the process 200 continues by modifying user input options for interacting with the VR simulation. This is illustrated at step 230. For example, if the user has a leg impairment, the system may modify user input options to require the user to perform actions with their arms only rather than using their legs within the VR simulation.

Once the input options are modified, the process 200 continues by modifying the rendering of the VR simulation in a display of a VR device based on the modified user input options. This is illustrated at step 235. The VR simulation will be modified to accommodate any physical characteristics determined for the user. For example, a VR game that requires the user to jump over an object (e.g., rolling barrel) may be modified to require the user to swing over the object by grabbing a rope with their hands. This input action requires the use of the user's arms rather than the legs. In this way, the user can still play the VR game with slight modifications to the rendered output in order to accommodate the user's physical capabilities.

Figure 3A:
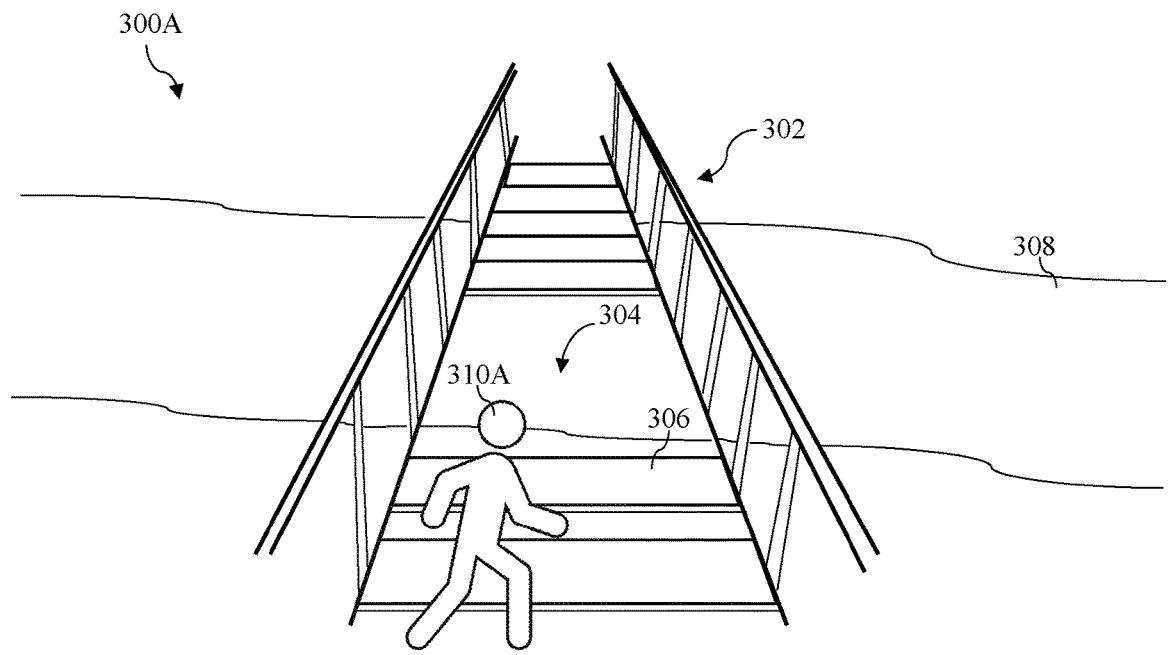
FIG. 3A illustrates an example rendering of a non-modified VR simulation for a first user, in accordance with embodiments of the present disclosure.

Referring now to FIG. 3A, shown is an example rendering of a non-modified VR simulation 300A for a first user 310A, in accordance with embodiments of the present disclosure. In the illustrated embodiment, the VR simulation 300A depicts a perspective view of a bridge 302 spanning a river 308. The bridge 302 includes a plurality of planks 306 that make up the walking section of the bridge 302. However, the bridge 302 is missing a plank, such that a gap 304 is formed within the walking section of bridge 302. Because of the gap 304, the first user 310A is required to perform a jumping action in order to proceed within the VR simulation 300A. Because no physical characteristics (e.g., leg impairment affecting jumping actions) have been identified for the first user 310A by the system, the VR simulation 300A has not been modified. Therefore, in order to proceed within the VR simulation 300A, the user 310A must perform a jumping action.

Figure 3B:
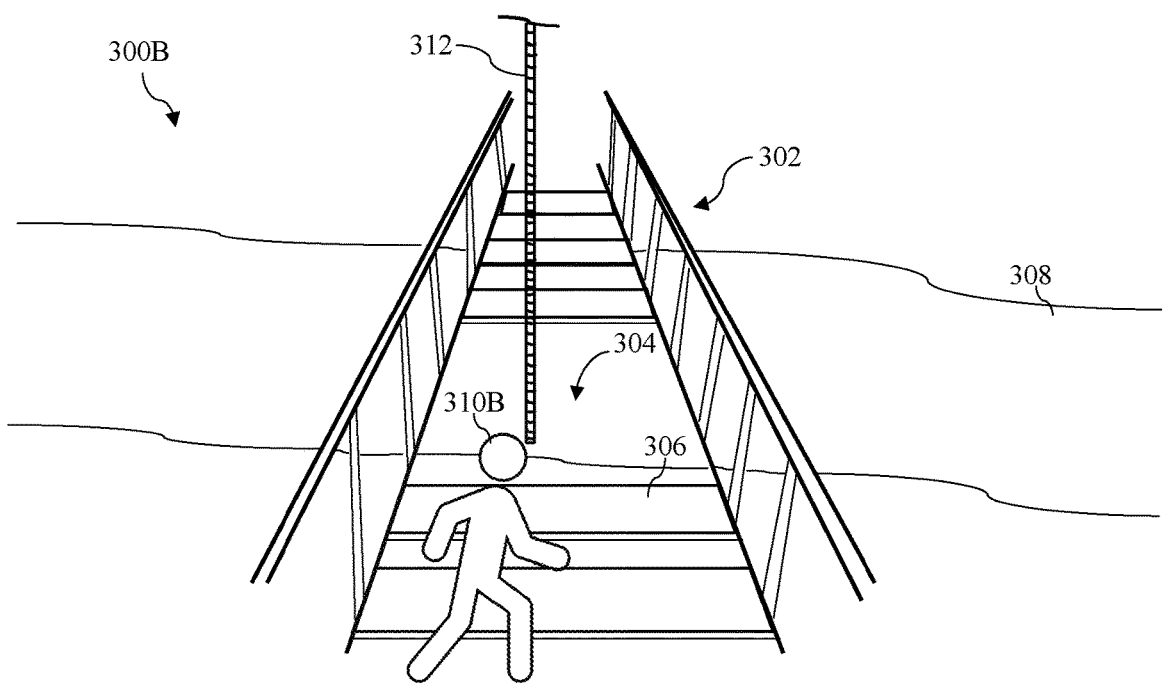
FIG. 3B illustrates an example rendering of a modified VR simulation for a second user, in accordance with embodiments of the present disclosure.

Referring now to FIG. 3B, shown is an example rendering of a modified VR simulation 300B for a second user 310B, in accordance with embodiments of the present disclosure. Similar to the non-modified VR simulation 300A in FIG. 3A, the modified VR simulation 300B depicts a perspective view of a bridge 302 spanning a river 308. The bridge 302 includes a plurality of planks 306, and a missing plank creating gap 304. However, the second user 310B has been determined to have a personal health factor (e.g., user is in a wheelchair) that affects their jumping action (e.g., physical characteristic). Because the second user 310B is unable to perform a jumping action, the system has modified the VR simulation 300B to include a rope 312. In this way, the second user 310B may proceed on the bridge 302 by using their arms to grab the rope 312 to traverse the gap 304. In this way, the system rendered the modified VR simulation 300B to suit the physical capabilities of the second user 310B.

Referring now to FIG. 4, shown is an example mapping table 400, in accordance with embodiments of the present disclosure. The mapping table 400 exemplified in FIG. 4 is only used as an example and is not meant to be limiting. In other embodiments, the mapping table 400 may include alternative types of VR simulations, personal health factors, and the like.

In the illustrated embodiment, the mapping table 400 includes three different VR simulations 401 that are modified based on a personal health factor 402 for a user. User input modification 404 is based on the identified physical characteristic 403 that corresponds to the determined personal health factor 402 for each user. Once the user input modification 404 is determined, the VR simulation modification 405 is rendered by the system accordingly.

For example, the VR simulation 401 of a horseshoe throwing game has been modified for a user that has been determined to have a cast on their left arm/hand through image recognition analysis. Because the user cannot user their left arm, the user input modification 404 has been changed to shift all user interface (UI) interaction to the right side of the UI. Therefore, the VR simulation modification 405 has been updated to render horseshoes to be thrown from the right side of a virtual user shown on the UI.

In another example, the VR simulation 401 of an adventure game has been modified for a user that has been determined to have a leg impairment through interaction data analysis taken from one or more VR simulations. Based on the physical characteristic 403 identified for the user, the system has changed the user input modification 404 to require the user to swing their arms in jumping scenarios, while the VR simulation modification 405 will include a rope for the user to grab in jumping scenarios.

In another example, the VR simulation 401 of a racing game is modified for a user that suffers from motion sickness. This personal health factor 402 was entered manually by the user. The user input modification 404 has been adjusted to limit head turning interactions to prevent fast movements that may cause the user to become sick. Further the VR simulation modification 405 has been configured to render straight racing tracks to further prevent motion sickness.

Referring now to FIG. 5, shown is a flow diagram of an example process 500 for analyzing historical user action data to identify one or more personal health factors, in accordance with embodiments of the present disclosure. Process 500 may be in addition to or a subset of process 200. The process 500 may be performed by processing logic that comprises hardware (e.g., circuitry, dedicated logic, programmable logic, microcode, etc.), software (e.g., instructions run on a processor to perform hardware simulation), firmware, or a combination thereof. In some embodiments, the process 500 is a computer-implemented process. The process 500 may be performed by processor 104 exemplified in FIG. 1.

The process 500 begins by analyzing historical data corresponding to actions performed by the user interacting in a VR simulation. This is illustrated at step 505. The analyzing may be performed using machine learning module 114 exemplified in FIG. 1. For example, the system may analyze various throwing movements performed by the user while immersed in a VR simulation that requires the user to throw an object with both hands. The system may determine by analyzing the action data that the user has not used the right arm for throwing actions.

Once the system has analyzed the historical data, the process 500 continues by identifying one or more personal health factors from the analyzed data. This is illustrated at step 510. For example, based on the analyzed data indicating the user has not used their right arm to throw an object requiring both arms, the system may identify that the user has limited use of their right arm. The system may identify this as a personal health factor and update the user's profile information to include it. Once identified, the VR system may modify further VR simulations that require the use of both arms to only require the use of the user's left arm to accommodate the user's physical capabilities.

Referring now to FIG. 6, shown is a flow diagram of an example process 600 for analyzing crowdsourced historical data for a plurality of users to improve modification of the VR simulation, in accordance with embodiments of the present disclosure. Process 600 may be in addition to or a subset of process 200. The process 600 may be performed by processing logic that comprises hardware (e.g., circuitry, dedicated logic, programmable logic, microcode, etc.), software (e.g., instructions run on a processor to perform hardware simulation), firmware, or a combination thereof. In some embodiments, the process 600 is a computer-implemented process. The process 600 may be performed by processor 104 exemplified in FIG. 1.

The process 600 begins by receiving crowdsourced data for a plurality of users. This is illustrated at step 605. In embodiments, the crowdsourced data corresponds to historical actions performed by the plurality of users within a plurality of modified virtual simulations. For example, the system may receive historical action data for multiple users that have various leg impairments.

The process 600 continues by analyzing, utilizing machine learning, the crowdsourced data. This is illustrated at step 610. The analyzing may be performed using machine learning module 114 exemplified in FIG. 1. For example, the system may analyze the crowdsource data to determine that the modification of the VR simulation was not performed appropriately to match the personal health factors of the users. For example, historical action data may indicate that half the users with the leg impairment were unable to complete tasks even in the modified VR simulation.

The process 600 continues by generating, based on the analyzing, a mapping table for rending modified VR simulations. This is illustrated at step 615. Based on the analysis of the crowdsourced data, the system may use machine learning to predict suitable modifications to the VR simulation by determining what historical modifications have been successful for users with certain physical characteristics. In this way, the system may create a more accurate mapping of the personal health factors to the modification of the VR simulation for each user. By improving the in-game modification to correspond appropriately to each user's physical capabilities, the system may present a more enjoyable VR experience.

Figure 7:
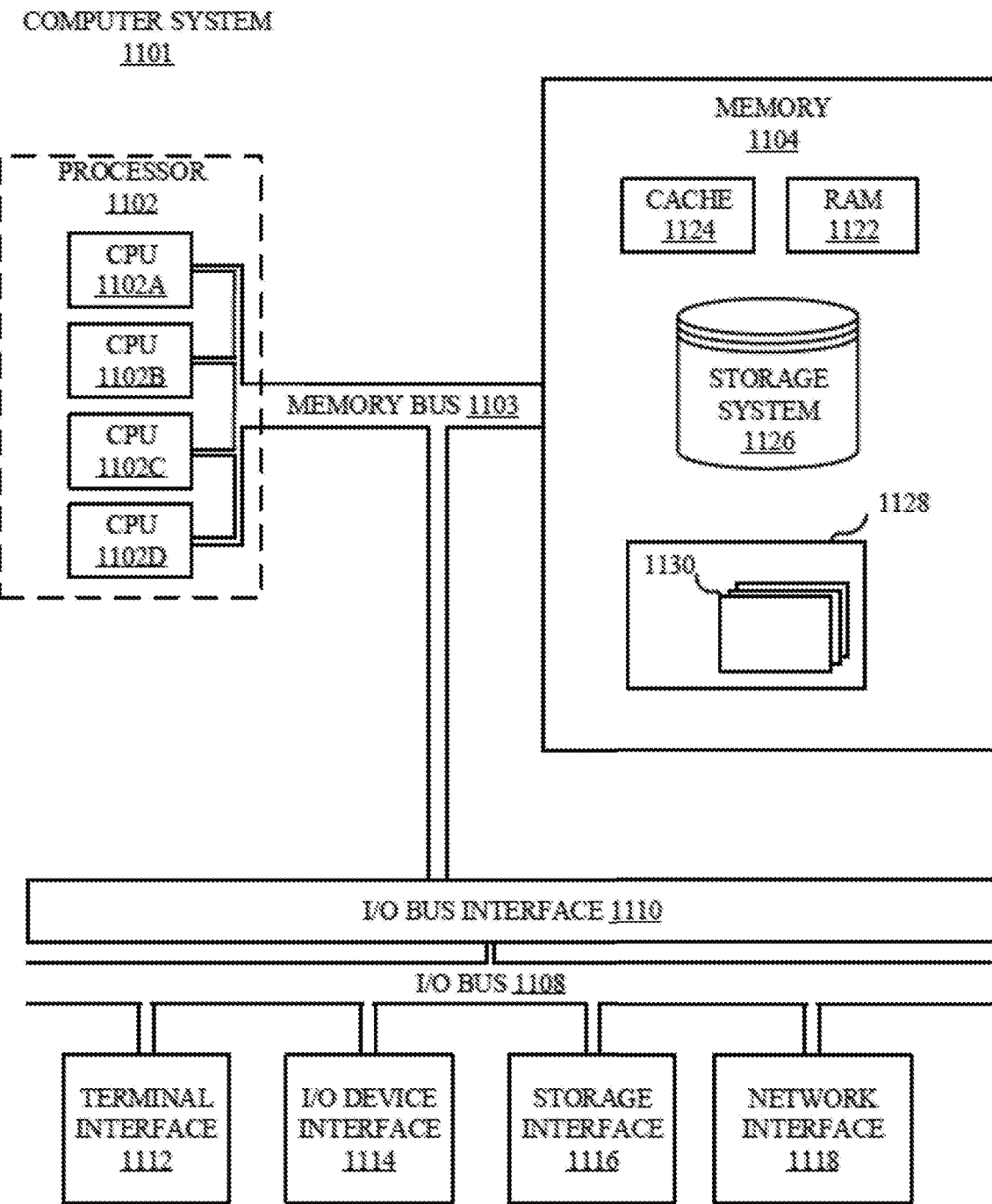
FIG. 7 illustrates a high-level block diagram of an example computer system that may be used in implementing one or more of the methods, tools, and modules, and any related functions, described herein, in accordance with embodiments of the present disclosure.

Referring now to FIG. 7, shown is a high-level block diagram of an example computer system 1101 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 1101 may comprise one or more CPUs 1102, a memory subsystem 1104, a terminal interface 1112, a storage interface 1116, an I/O (Input/Output) device interface 1114, and a network interface 1118, all of which may be communicatively coupled, directly or indirectly, for inter-component communication via a memory bus 1103, an I/O bus 1108, and an I/O bus interface unit 1110.

The computer system 1101 may contain one or more general-purpose programmable central processing units (CPUs) 1102A, 1102B, 1102C, and 1102D, herein generically referred to as the CPU 1102. In some embodiments, the computer system 1101 may contain multiple processors typical of a relatively large system; however, in other embodiments the computer system 1101 may alternatively be a single CPU system. Each CPU 1102 may execute instructions stored in the memory subsystem 1104 and may include one or more levels of on-board cache. In some embodiments, a processor can include at least one or more of, a memory controller, and/or storage controller. In some embodiments, the CPU can execute the processes included herein (e.g., process 200, 500, and 600).

System memory 1104 may include computer system readable media in the form of volatile memory, such as random access memory (RAM) 1122 or cache memory 1124. Computer system 1101 may further include other removable/non-removable, volatile/non-volatile computer system data storage media. By way of example only, storage system 1126 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 1104 can include flash memory, e.g., a flash memory stick drive or a flash drive. Memory devices can be connected to memory bus 1103 by one or more data media interfaces. The memory 1104 may include at least one program product having a set (e.g., at least one) of program modules that are configured to carry out the functions of various embodiments.

Although the memory bus 1103 is shown in FIG. 7 as a single bus structure providing a direct communication path among the CPUs 1102, the memory subsystem 1104, and the I/O bus interface 1110, the memory bus 1103 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 1110 and the I/O bus 1108 are shown as single units, the computer system 1101 may, in some embodiments, contain multiple I/O bus interface units 1110, multiple I/O buses 1108, or both. Further, while multiple I/O interface units are shown, which separate the I/O bus 1108 from various communications paths running to the various I/O devices, in other embodiments some or all of the I/O devices may be connected directly to one or more system I/O buses.

In some embodiments, the computer system 1101 may be a multi-user mainframe computer system, a single-user system, or a server computer or similar device that has little or no direct user interface, but receives requests from other computer systems (clients). Further, in some embodiments, the computer system 1101 may be implemented as a desktop computer, portable computer, laptop or notebook computer, tablet computer, pocket computer, telephone, smart phone, network switches or routers, or any other appropriate type of electronic device.

It is noted that FIG. 7 is intended to depict the representative major components of an exemplary computer system 1101. In some embodiments, however, individual components may have greater or lesser complexity than as represented in FIG. 7, components other than or in addition to those shown in FIG. 6 may be present, and the number, type, and configuration of such components may vary.

One or more programs/utilities 1128, each having at least one set of program modules 1130 may be stored in memory 1104. The programs/utilities 1128 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 1128 and/or program modules 1130 generally perform the functions or methodologies of various embodiments.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
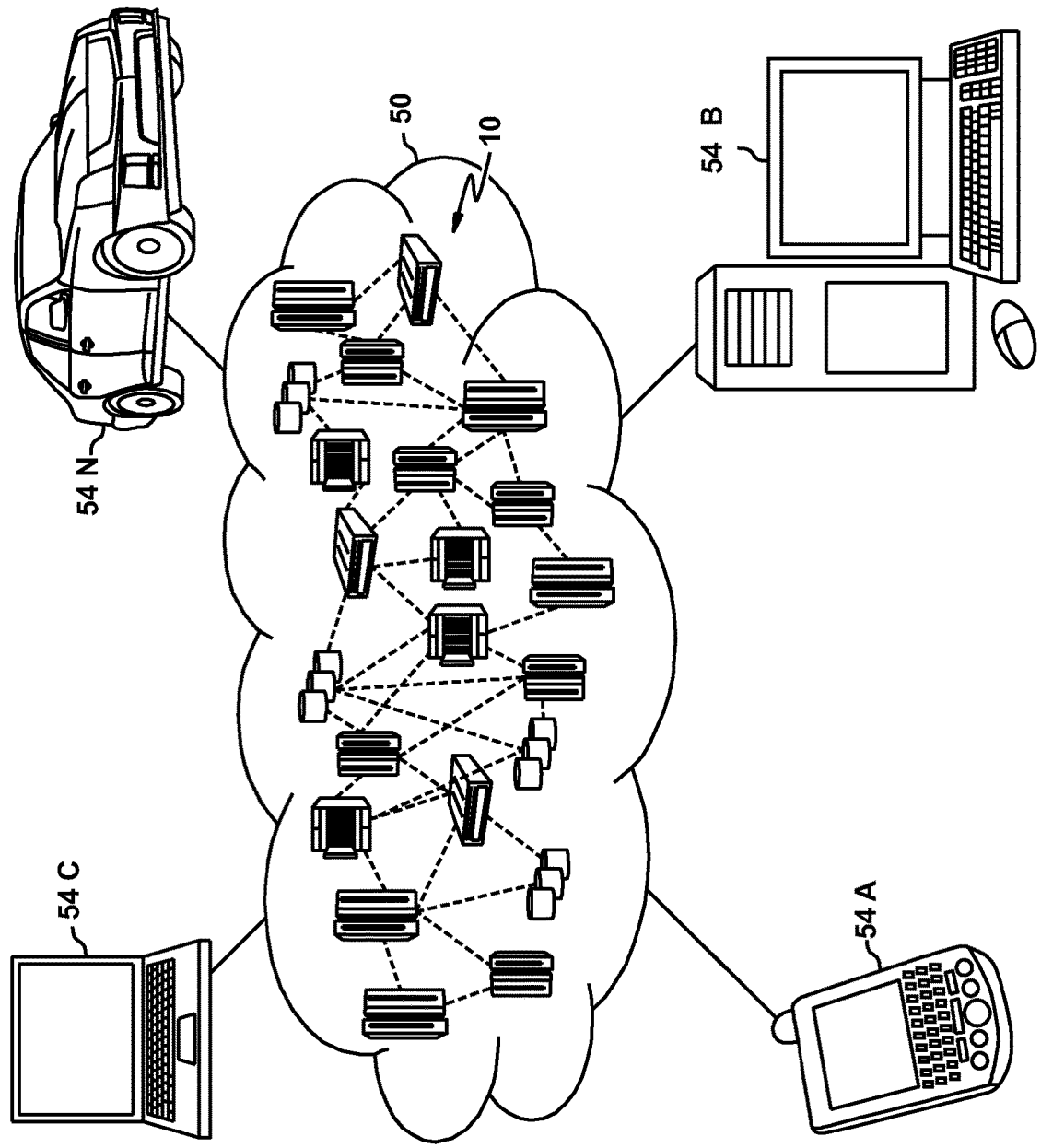
FIG. 8 depicts a cloud computing environment according to an embodiment of the present invention.

Referring now to FIG. 8, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
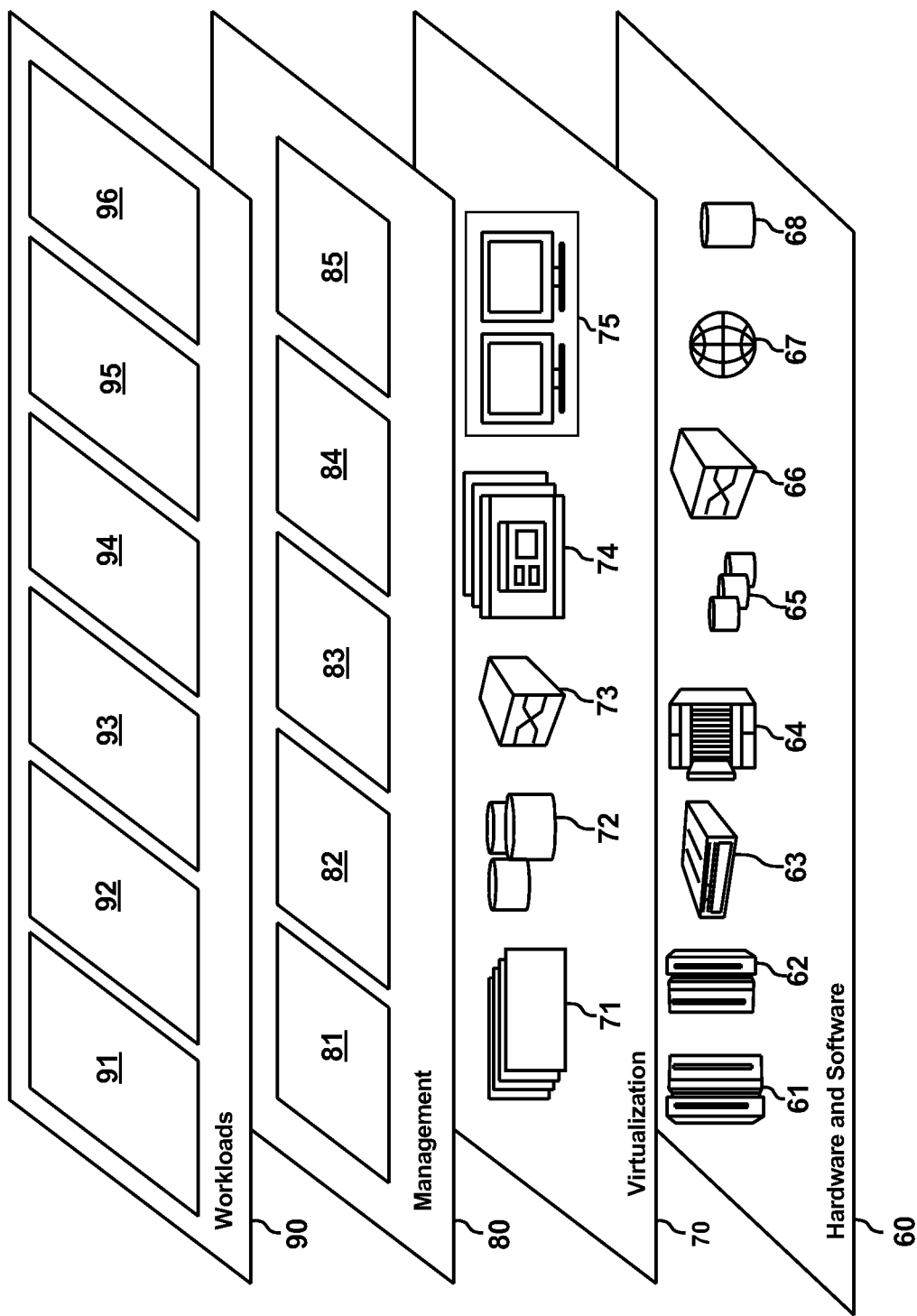
FIG. 9 depicts abstraction model layers according to an embodiment of the present invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and mobile desktops 96.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
   receiving one or more personal health factors corresponding to a user;
   preparing a virtual reality (VR) simulation for a rendering;
   identifying one or more physical characteristics of the user from the personal health factors;
   determining that the one or more physical characteristics restrict the user from completing a first task within the VR simulation using a first input option, wherein the first input option requires physical movement of a lower extremity;
   identifying, based on the one or more physical characteristics that restrict the user from completing the first task, a second input option that accommodates the one or more physical characteristics, wherein the second input option requires physical movement of an upper extremity;
   modifying, in response to identifying the second input option, the first input option to the second input option for completing a second task within the VR simulation, wherein completing the second task requires using the second input option; and
   modifying, dynamically, the rendering of the first task to the second task within the VR simulation in a display of a VR device.

2. The computer-implemented method of claim 1, further comprising:
   analyzing one or more images captured of the user; and
   identifying, from the one or more images, the one or more personal health factors corresponding to the user.

3. The computer-implemented method of claim 2, wherein the one or more images are received from a camera communicatively coupled to the VR device.

4. The computer-implemented method of claim 1, wherein the personal health factors corresponding to the user are received from a user profile.

5. The computer-implemented method of claim 1, further comprising:
   analyzing, using machine learning, historical data corresponding to actions performed by the user interacting in a prior virtual simulation session; and
   identifying, in response to analyzing the historical data, the one or more personal health factors.

6. The computer-implemented method of claim 1, wherein the first task is virtualized in an environment of the VR simulation.

7. The computer-implemented method of claim 1, wherein the first task requires the user to jump over a first object and the second task requires the user to grab a second object.

8. The computer-implemented method of claim 1, wherein the one or more personal health factors corresponding to the user comprise a lower extremity impairment, and wherein the one or more physical characteristics indicate the user has a lack of lower extremity movement.

9. A virtual reality (VR) system, comprising:
   a VR device;
   a processor; and
   a computer-readable storage medium communicatively coupled to the processor and storing program instructions which, when executed by the processor, cause the processor to perform a method comprising:
   receiving one or more personal health factors corresponding to a user;
   preparing a VR simulation for a rendering;
   identifying one or more physical characteristics of the user from the personal health factors;
   determining that the one or more physical characteristics restrict the user from completing a first task within the VR simulation using a first input option, wherein the first input option requires physical movement of a lower extremity;
   identifying, based on the one or more physical characteristics that restrict the user from completing the first task, a second input option that accommodates the one or more physical characteristics, wherein the second input option requires physical movement of an upper extremity;
   modifying, in response to identifying the second input option, the first input option to the second input option for completing a second task within the VR simulation, wherein completing the second task requires using the second input option; and modifying, dynamically, the rendering of the first task to the second task within the VR simulation in a display of the VR device.

10. The VR system of claim 9, wherein the method performed by the processor further comprises:

analyzing one or more images captured of the user; and identifying from the one or more images the one or more personal health factors corresponding to the user.

11. The VR system of claim 9, wherein the personal health factors corresponding to the user are received from a user profile.

12. The VR system of claim 9, wherein the method performed by the processor further comprises:

analyzing, using machine learning, historical data corresponding to actions performed by the user interacting in a prior virtual simulation session; and identifying, in response to analyzing the historical data, the one or more personal health factors.

13. The VR system of claim 9, wherein the method performed by the processor further comprises:

receiving crowdsourced data for a plurality of users, wherein the crowdsourced data corresponds to historical actions performed by the plurality of users within one or more VR simulations;

analyzing, utilizing machine learning, the crowdsourced data; and generating, based on the analyzing, a mapping table for rending modified VR simulations.

14. A computer program product comprising a computer-readable storage medium having program instructions embodied therewith, wherein the computer-readable storage medium is not a transitory signal per se, the program instructions executable by a processor to cause the processor to perform a method comprising:

receiving one or more personal health factors corresponding to a user;

preparing a VR simulation for a rendering;

identifying one or more physical characteristics of the user from the personal health factors;

determining that the one or more physical characteristics restrict the user from completing a first task within the VR simulation using a first input option, wherein the first input option requires physical movement of a lower extremity;

identifying, based on the one or more physical characteristics that restrict the user from completing the first task, a second input option that accommodates the one or more physical characteristics, wherein the second input option requires physical movement of an upper extremity;

modifying, in response to identifying the second input option, the first input option to the second input option for completing a second task within the VR simulation, wherein completing the second task requires using the second input option; and modifying, dynamically, the rendering of the first task to the second task within the VR simulation in a display of the VR device.

15. The computer program product of claim 14, wherein the method performed by the processor further comprise:

analyzing one or more images captured of the user; and identifying from the one or more images the one or more personal health factors corresponding to the user.

16. The computer program product of claim 14, wherein the personal health factors corresponding to the user are received from a user profile.

17. The computer program product of claim 14, wherein the method performed by the processor further comprises:

analyzing, using machine learning, historical data corresponding to actions performed by the user interacting in a prior virtual simulation session; and identifying, in response to analyzing the historical data, the one or more personal health factors.

18. The computer program product of claim 14, wherein the method performed by the processor further comprises:

receiving crowdsourced data for a plurality of users, wherein the crowdsourced data corresponds to historical actions performed by the plurality of users within one or more VR simulations;

analyzing, utilizing machine learning, the crowdsourced data; and generating, based on the analyzing, a mapping table for rending modified VR simulations.

* * * * *